US00RE47977E

(19) United States
(12) Reissued Patent
Wu et al.

(10) Patent Number: US RE47,977 E
(45) Date of Reissued Patent: May 5, 2020

(54) DATA CONTROL CIRCUIT

(71) Applicant: Novatek Microelectronics Corp., Hsinchu (TW)

(72) Inventors: Tse-Hung Wu, New Taipei (TW); Chao-Kai Tu, Hsinchu (TW); Chia-Wei Su, Hsinchu (TW)

(73) Assignee: Novatek Microelectronics Corp., Hsinchu (TW)

(21) Appl. No.: 16/221,618

(22) Filed: Dec. 17, 2018

Related U.S. Patent Documents

Reissue of:
(64) Patent No.: 9,537,487
Issued: Jan. 3, 2017
Appl. No.: 14/582,201
Filed: Dec. 24, 2014

U.S. Applications:
(62) Division of application No. 13/938,225, filed on Jul. 9, 2013, now abandoned.

(30) Foreign Application Priority Data

Dec. 24, 2012 (TW) ..... 101149597 A

(51) Int. Cl.
*H03K 19/0175* (2006.01)
*H03K 17/16* (2006.01)

(52) U.S. Cl.
CPC ... *H03K 19/017509* (2013.01); *H03K 17/162* (2013.01); *H03K 2217/0054* (2013.01)

(58) Field of Classification Search
CPC .. H03K 17/16; H03K 17/162; H03K 19/0175; H03K 19/017509; H03K 2217/0054
(Continued)

(56) References Cited

U.S. PATENT DOCUMENTS 3,716,723 A * 2/1973 Heuner ..... G11C 19/184 327/141
4,209,713 A 6/1980 Satou et al.
(Continued)

FOREIGN PATENT DOCUMENTS

CN 1338822 3/2002
CN 1518224 8/2004

OTHER PUBLICATIONS

"Office Action of Taiwan Counterpart Application", issued on Apr. 20, 2015, p. 1-p. 8.

(Continued)

*Primary Examiner* — My Trang Ton
(74) *Attorney, Agent, or Firm* — JCIPRNET

(57) ABSTRACT

A data control circuit includes an output stage circuit, a switch circuit, and an impedance module. The output stage circuit outputs a data signal. An input terminal of the switch circuit is coupled to an output terminal of the output stage circuit, and an output terminal of the switch circuit is coupled to a post-stage circuit. According to a control of a control signal, the switch circuit determines whether to transmit the data signal of the output stage circuit to the post-stage circuit. The impedance module is configured in the output stage circuit, configured between the output stage circuit and the switch circuit, or configured in the switch circuit. Here, the impedance module reduces noise flowing from the switch circuit to the output stage circuit.

13 Claims, 12 Drawing Sheets

(58) Field of Classification Search
USPC ..... 326/21, 30, 82–83, 93, 95–98, 112–113; 327/108–109, 382, 384, 419, 427, 437
See application file for complete search history.

(56) References Cited

U.S. PATENT DOCUMENTS

| | | | | |
|---|---|---|---|---|
| 4,800,303 | A * | 1/1989 | Graham | H03K 19/0952 326/30 |
| 5,376,848 | A * | 12/1994 | Hanke, III | H03K 3/35625 327/141 |
| 5,811,992 | A | 9/1998 | D'Souza | |
| 5,920,210 | A * | 7/1999 | Kaplinsky | H03K 3/3565 326/21 |
| 5,956,008 | A * | 9/1999 | Kawasaki | G09G 3/3688 345/100 |
| 6,144,251 | A * | 11/2000 | Ogawa | G06F 1/3253 327/544 |
| 6,380,781 | B1 * | 4/2002 | Karnik | G01R 31/318525 326/98 |
| 6,636,105 | B2 | 10/2003 | Soda | |
| 6,707,324 | B1 | 3/2004 | Chu | |
| 7,038,513 | B2 * | 5/2006 | Wilson | H03K 5/023 327/112 |
| 7,307,458 | B1 * | 12/2007 | Segervall | G06F 13/4072 326/30 |
| 7,750,705 | B2 * | 7/2010 | Ueno | H03K 3/356165 326/33 |
| 7,986,162 | B2 * | 7/2011 | Ueno | H03K 3/356165 326/27 |
| 8,018,264 | B2 * | 9/2011 | Ueno | H03K 3/356165 326/33 |
| 2002/0017935 | A1 | 2/2002 | Soda | |
| 2004/0119505 | A1 * | 6/2004 | Ryan | H03K 3/356173 326/112 |
| 2009/0251173 | A1 * | 10/2009 | Zhang | H03K 19/018521 326/81 |
| 2010/0220094 | A1 * | 9/2010 | Watanabe | G09G 3/3677 345/213 |
| 2010/0222094 | A1 * | 9/2010 | Usuda | H04L 1/0057 455/522 |
| 2011/0273925 | A1 | 11/2011 | Yamamoto et al. | |
| 2014/0176227 | A1 * | 6/2014 | Wu | H03K 17/162 327/437 |

OTHER PUBLICATIONS

"Office Action of China Counterpart Application", issued on Apr. 12, 2016, p. 1-p. 9.

* cited by examiner

DATA CONTROL CIRCUIT

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This application is *a reissue application of U.S. application Ser. No. 14/582,201 which is* a divisional application of and claims the priority benefit of a prior application Ser. No. 13/938,225, filed on Jul. 9, 2013, now pending. The prior application Ser. No. 13/938,225 claims the priority benefit of Taiwan application serial no. 101149597, filed on Dec. 24, 2012. The entirety of each of the above-mentioned patent applications is hereby incorporated by reference herein and made a part of this specification.

BACKGROUND OF THE INVENTION

Field of the Invention

The invention relates to an electronic circuit, and more particularly to a data control circuit capable of reducing switching noise.

Description of Related Art

When data transmission technologies are applied, a switch device or a switch circuit is often configured on a transmission path in a circuitry system, so as to control transmission of data and information in the circuitry system. Nonetheless, a pre-stage circuit coupled to the switch circuit may be interfered by the noise generated by the switch circuit, such that data of the pre-stage circuit cannot be correctly processed. Therefore, how to effectively eliminate or reduce the switching noise in a data control circuit and prevent the noise from affecting the correct transmission of signals is one of the topics worth discussing.

SUMMARY OF THE INVENTION

The invention is directed to a data control circuit for reducing noise flowing from a switch circuit to an output stage circuit (a pre-stage circuit), so as to prevent the operation of the pre-stage circuit from being interfered.

In an embodiment of the invention, a data control circuit that includes an output stage circuit, a switch circuit, and an impedance module is provided. The output stage circuit outputs a data signal. The output stage circuit comprises a first n-type transistor and a first p-type transistor. The source terminal of the first n-type transistor is coupled to a ground voltage. The gate terminal of the first n-type transistor is coupled to the input terminal of the output stage circuit. The gate terminal of the first p-type transistor is coupled to the gate terminal of the first n-type transistor. The drain terminal of the first p-type transistor is coupled to an output terminal of the output stage circuit. The source terminal of the first p-type transistor is coupled to a system voltage. The input terminal of the switch circuit is coupled to the output terminal of the output stage circuit. The output terminal of the switch circuit is coupled to a post-stage circuit. Wherein, the switch circuit determines whether to transmit the data signal of the output stage circuit to the post-stage circuit according to a control signal. The impedance module is configured in the output stage circuit for reducing noise flowing from the switch circuit to the output stage circuit. Wherein, the impedance module is coupled between a drain terminal of the first n-type transistor and the output terminal of the output stage circuit.

In view of the above, the impedance module is additionally configured on a path where the noise flows, so as to effectively reduce noise interference caused by the switch circuit in the data control circuit.

In order to make the aforementioned and other features and advantages of the invention comprehensible, embodiments accompanied with figures are described in detail below.

DETAILED DESCRIPTION OF DISCLOSED EMBODIMENTS

Figure 1:
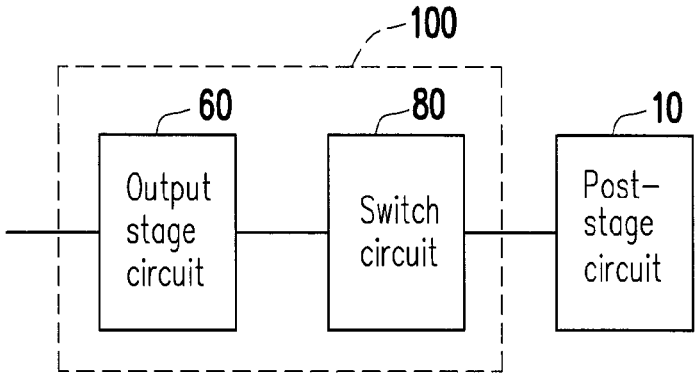
FIG. 1 is a schematic block diagram illustrating a data control circuit according to an embodiment of the invention.

FIG. 1 is a schematic block diagram illustrating a data control circuit according to an embodiment of the invention. With reference to FIG. 1, a data control circuit 100 includes an output stage circuit 60 and a switch circuit 80. An output terminal of the output stage circuit 60 is coupled to an input terminal of the switch circuit 80, so as to output a data signal. An output terminal of the switch circuit 80 is coupled to a post-stage circuit 10. In different embodiments, the output stage circuit 60 may include an inverter circuit, a latch, a buffer, or any other signal output circuit. The switch circuit 80 determines whether to transmit the data signal of the output stage circuit 60 to the post-stage circuit 10 according to a control of a control signal.

In the present embodiment, the data control circuit 100 further includes an impedance module which is not shown in FIG. 1 but will be elaborated hereinafter. The impedance module is configured in the output stage circuit 60, configured between the output stage circuit 60 and the switch circuit 80, or configured in the switch circuit 80. Since the impedance module is configured on a path where noise flows, the impedance module is able to effectively reduce the noise flowing from the switch circuit 80 to the output stage circuit 60. Here, the impedance module may be at least one resistor, an n-type transistor (i.e., an n-channel transistor), a p-type transistor (i.e., a p-channel transistor), or any other circuit that may provide impedance.

Figure 2:
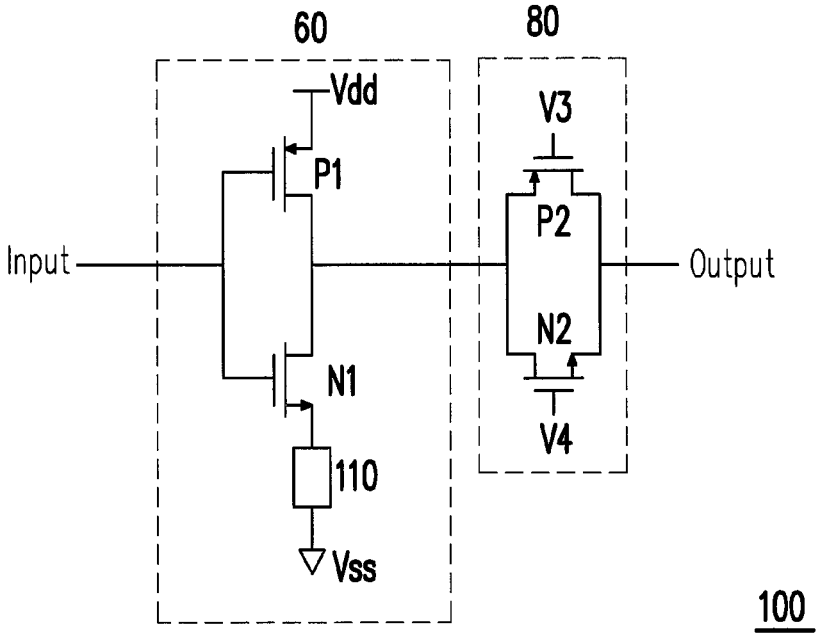
FIG. 2 is a schematic diagram illustrating a data control circuit according to a first embodiment of the invention.

FIG. 2 is a schematic diagram illustrating a data control circuit according to a first embodiment of the invention. With reference to FIG. 1 and FIG. 2, a data control circuit 100 includes an output stage circuit 60, a switch circuit 80, and an impedance module 110. In the present embodiment, the output stage circuit 60 includes a first inverter circuit. An input terminal of the first inverter circuit is coupled to an input terminal of the output stage circuit 60, and an output terminal of the first inverter circuit is coupled to the output terminal of the output stage circuit 60. The first inverter circuit may be implemented in different manner according to different embodiments. For instance, the first inverter circuit may include an n-type transistor N1 and a p-type transistor P1. As shown in FIG. 2, a source terminal of the n-type transistor N1 is coupled to a ground voltage Vss through the impedance module 110, a drain terminal of the n-type transistor N1 is coupled to the drain terminal of the p-type transistor P1, and a gate terminal of the n-type transistor N1 is coupled to a gate terminal of the p-type transistor P1. The gate terminal of the p-type transistor P1 is coupled to the input terminal of the output stage circuit 60, the drain terminal of the p-type transistor P1 is coupled to the output terminal of the output stage circuit 60, and a source terminal of the p-type transistor P1 is coupled to a system voltage Vdd.

The switch circuit 80 includes an n-type transistor N2 and a p-type transistor P2. As shown in FIG. 2, a source terminal of the n-type transistor N2 is coupled to an output terminal of the switch circuit 80, a drain terminal of the n-type transistor N2 is coupled to an input terminal of the switch circuit 80, and a gate terminal of the n-type transistor N2 is controlled by a control signal V4. A source terminal of the p-type transistor P2 is coupled to the input terminal of the switch circuit 80, a drain terminal of the p-type transistor P2 is coupled to the output terminal of the switch circuit 80, and a gate terminal of the p-type transistor P2 is controlled by a control signal V3. Here, the control signal V3 and the control signal V4 are inverted.

In the present embodiment, the data control circuit 100 is configured in a p-type substrate of an integrated circuit. Since the n-type transistor N2 is located in the p-type substrate, the switching noise (or the substrate noise) flows to the ground voltage Vss through the drain terminal of the n-type transistor N2, the drain terminal of the n-type transistor N1, a bulk of the n-type transistor N1, and the source terminal of the n-type transistor N1. Accordingly, all circuits coupled to the ground voltage Vss are interfered by the noise generated by the switch circuit 80. The impedance module 110 is located between the source terminal of the n-type transistor N1 and the ground voltage Vss, i.e., on the path where the noise flows, such that the amount of noise flowing to the ground voltage Vss may be significantly reduced. Here, the impedance module 110 may be an n-type transistor, for instance. A drain terminal of the n-type transistor is coupled to the source terminal of the n-type transistor N1, a source terminal of the n-type transistor is coupled to the ground voltage Vss, and a gate terminal of the n-type transistor is coupled to a fixed control voltage, for instance, so as to reduce the amount of noise energy. Accordingly, the noise interference caused by the switch circuit 80 may be effectively reduced by the data control circuit 100.

Figure 3:
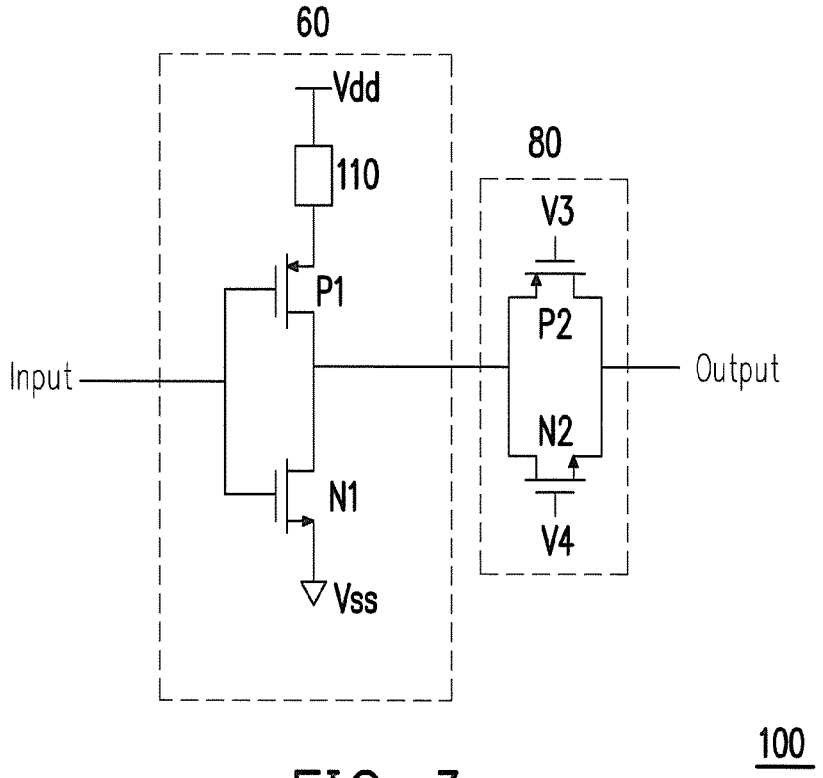
FIG. 3 is a schematic diagram illustrating a data control circuit according to a second embodiment of the invention.

However, the way to implement the data control circuit 100 shown in FIG. 1 should not be limited to that shown in FIG. 2. FIG. 3 is a schematic diagram illustrating a data control circuit according to a second embodiment of the invention. With reference to FIG. 1 and FIG. 3, a data control circuit 100 includes an output stage circuit 60, a switch circuit 80, and an impedance module 110. The description of the embodiment depicted in FIG. 3 may be deduced from the description of the embodiment shown in FIG. 2. Different from FIG. 2, FIG. 3 shows that the impedance module 110 is located between the source terminal of the p-type transistor P1 and the system voltage Vdd.

In the present embodiment, the data control circuit 100 is configured in an n-type substrate of an integrated circuit. Since the p-type transistor P2 is located in the n-type substrate, the switching noise (or the substrate noise) flows to the system voltage Vdd through the source terminal of the p-type transistor P2, the drain terminal of the p-type transistor P1, a bulk of the p-type transistor P1, and the source terminal of the p-type transistor P1. Accordingly, all circuits coupled to the system voltage Vdd are interfered by the noise generated by the switch circuit 80. The impedance module 110 is located between the source terminal of the p-type transistor P1 and the system voltage Vdd, i.e., on the path where the noise flows, such that the amount of noise flowing to the system voltage Vdd may be significantly reduced. Accordingly, the noise interference caused by the switch circuit 80 may be effectively reduced by the data control circuit 100.

Figure 4:
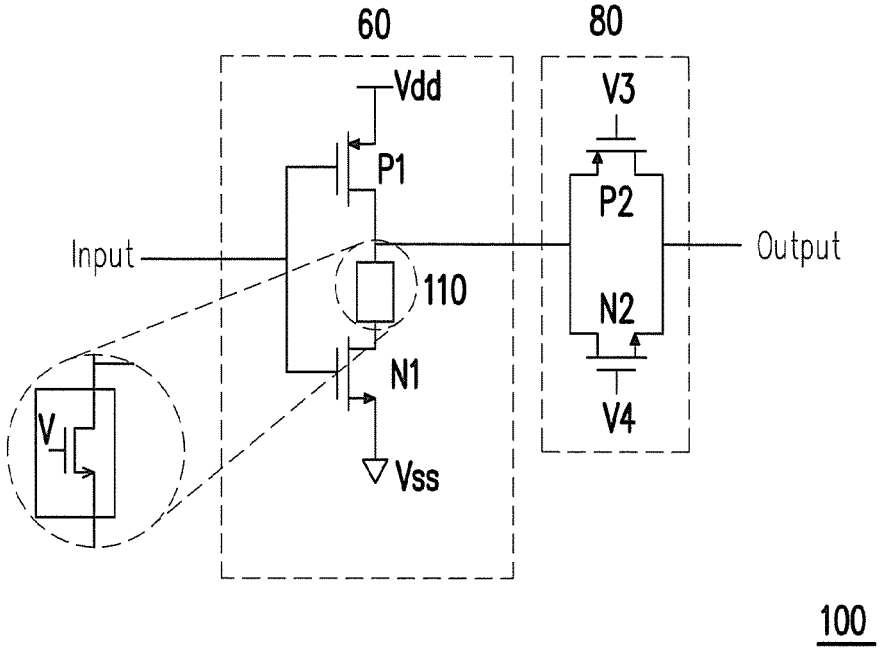
FIG. 4 is a schematic diagram illustrating a data control circuit according to a third embodiment of the invention.

FIG. 4 is a schematic diagram illustrating a data control circuit according to a third embodiment of the invention. With reference to FIG. 1 and FIG. 4, a data control circuit 100 includes an output stage circuit 60, a switch circuit 80, and an impedance module 110. The description of the embodiment depicted in FIG. 4 may be deduced from the description of the embodiment shown in FIG. 2. Different from FIG. 2, FIG. 4 shows that the impedance module 110 is located between the drain terminal of the n-type transistor N1 and the output terminal of the output stage circuit 60.

In the present embodiment, the data control circuit 100 is configured in a p-type substrate of an integrated circuit. Since the n-type transistor N2 is located in the p-type substrate, the switching noise (or the substrate noise) flows to the ground voltage Vss through the drain terminal of the n-type transistor N2, the drain terminal of the n-type transistor N1, the bulk of the n-type transistor N1, and the source terminal of the n-type transistor N1. The impedance module 110 is located between the drain terminal of the n-type transistor N1 and the output terminal of the output stage circuit 60, i.e., on the path where the noise flows, such that the amount of noise flowing to the ground voltage Vss may be significantly reduced. Here, the impedance module 110 may be a n-type transistor, for instance. A source terminal of the n-type transistor of the impedance module 110 is coupled to the drain terminal of the n-type transistor N1, a drain terminal of the n-type transistor of the impedance module 110 is coupled to the output terminal of the output stage circuit 60, and a gate terminal of the n-type transistor of the impedance module 110 is coupled to a fixed control voltage, for instance, so as to reduce the amount of noise energy. Accordingly, the noise interference caused by the switch circuit 80 may be effectively reduced by the data control circuit 100.

Figure 5:
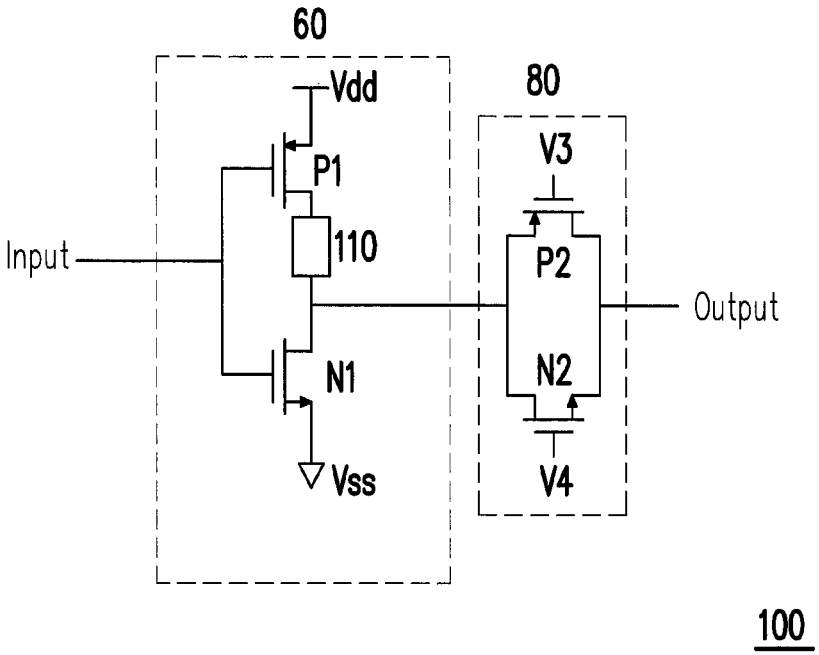
FIG. 5 is a schematic diagram illustrating a data control circuit according to a fourth embodiment of the invention.

FIG. 5 is a schematic diagram illustrating a data control circuit according to a fourth embodiment of the invention. With reference to FIG. 1 and FIG. 5, a data control circuit 100 includes an output stage circuit 60, a switch circuit 80, and an impedance module 110. The description of the embodiment depicted in FIG. 5 may be deduced from the description of the embodiment shown in FIG. 3. Different from FIG. 3, FIG. 5 shows that the impedance module 110 is located between the drain terminal of the p-type transistor P1 and the output terminal of the output stage circuit 60.

In the present embodiment, the data control circuit 100 is configured in an n-type substrate of an integrated circuit. Since the p-type transistor P2 is located in the n-type substrate, the switching noise (or the substrate noise) flows to the system voltage Vdd through the source terminal of the p-type transistor P2, the drain terminal of the p-type transistor P1, a bulk of the p-type transistor P1, and the source terminal of the p-type transistor P1. The impedance module 110 is located between the drain terminal of the p-type transistor P1 and the output terminal of the output stage circuit 60, i.e., on the path where the noise flows, such that the amount of noise flowing to the system voltage Vdd may be significantly reduced. Accordingly, the noise interference caused by the switch circuit 80 may be effectively reduced by the data control circuit 100.

Figure 6:
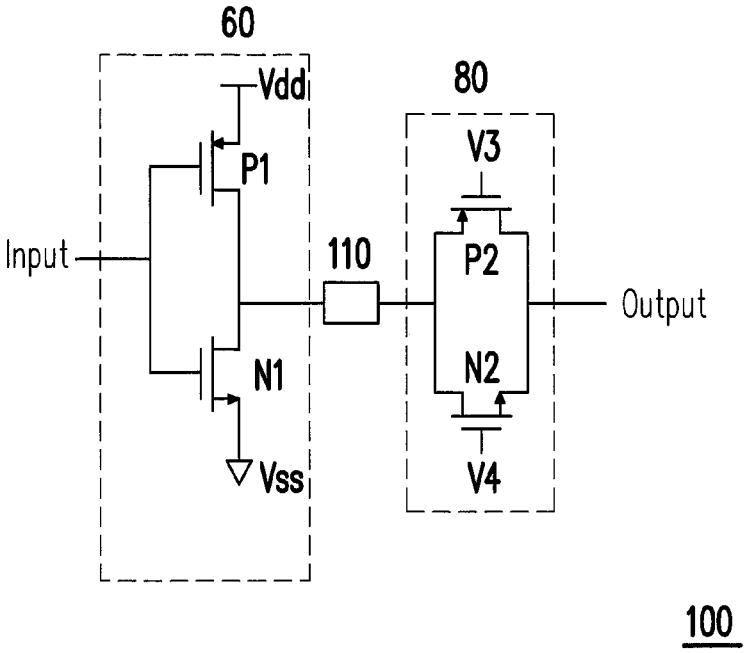
FIG. 6 is a schematic diagram illustrating a data control circuit according to a fifth embodiment of the invention.

FIG. 6 is a schematic diagram illustrating a data control circuit according to a fifth embodiment of the invention. With reference to FIG. 1 and FIG. 6, a data control circuit 100 includes an output stage circuit 60, a switch circuit 80, and an impedance module 110. The description of the embodiment depicted in FIG. 6 may be deduced from the descriptions of the embodiments shown in FIG. 2 to FIG. 5. Different from FIG. 2 to FIG. 5, FIG. 6 shows that the impedance module 110 is coupled to a transmission path between the output terminal of the output stage circuit 60 and the input terminal of the switch circuit 80.

In some embodiments of the invention, the switching noise (or the substrate noise) flows to the system voltage Vdd through the source terminal of the p-type transistor P2, the drain terminal of the p-type transistor P1, the bulk of the p-type transistor P1, and the source terminal of the p-type transistor P1. In other embodiments of the invention, the switching noise (or the substrate noise) flows to the ground voltage Vss through the drain terminal of the n-type transistor N2, the drain terminal of the n-type transistor N1, the bulk of the n-type transistor N1, and the source terminal of the n-type transistor N1. The impedance module 110 is located between the output terminal of the output stage circuit 60 and the input terminal of the switch circuit 80, i.e., on the path where the noise flows, such that the amount of noise flowing to the system voltage Vdd and the ground voltage Vss may be significantly reduced. Accordingly, the noise interference caused by the switch circuit 80 may be effectively reduced by the data control circuit 100.

Figure 7:
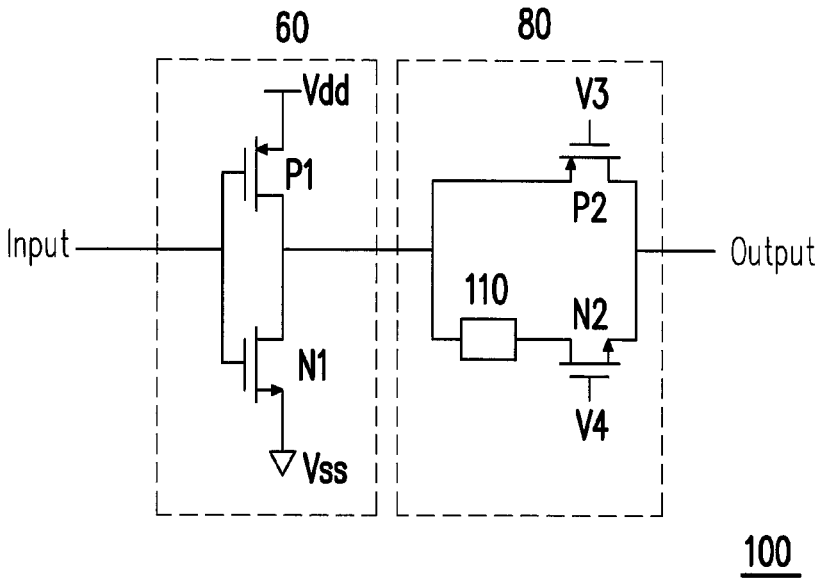
FIG. 7 is a schematic diagram illustrating a data control circuit according to a sixth embodiment of the invention.

FIG. 7 is a schematic diagram illustrating a data control circuit according to a sixth embodiment of the invention. With reference to FIG. 1 and FIG. 7, a data control circuit 100 includes an output stage circuit 60, a switch circuit 80, and an impedance module 110. The description of the embodiment depicted in FIG. 7 may be deduced from the description of the embodiment shown in FIG. 2. Different from FIG. 2, FIG. 7 shows that the impedance module 110 is coupled between the drain terminal of the n-type transistor N2 and the input terminal of the switch circuit 80.

In the present embodiment, the data control circuit 100 is configured in a p-type substrate of an integrated circuit. Since the n-type transistor N2 is located in the p-type substrate, the switching noise (or the substrate noise) flows to the ground voltage Vss through the drain terminal of the n-type transistor N2, the drain terminal of the n-type transistor N1, the bulk of the n-type transistor N1, and the source terminal of the n-type transistor N1. The impedance module 110 is located between the drain terminal of the n-type transistor N2 and the input terminal of the switch circuit 80, i.e., on the path where the noise flows, such that the amount of noise flowing to the ground voltage Vss may be significantly reduced. Accordingly, the noise interference caused by the switch circuit 80 may be effectively reduced by the data control circuit 100.

Figure 8:
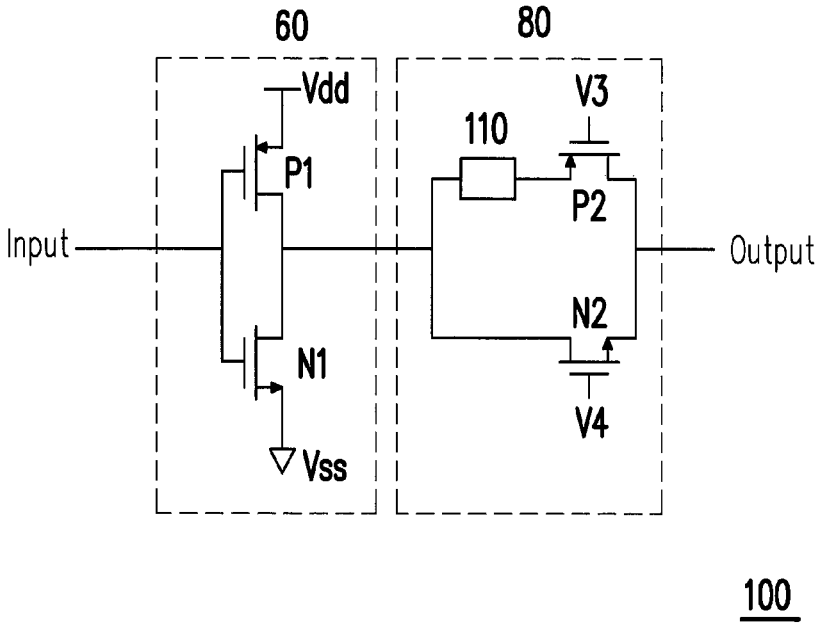
FIG. 8 is a schematic diagram illustrating a data control circuit according to a seventh embodiment of the invention.

FIG. 8 is a schematic diagram illustrating a data control circuit according to a seventh embodiment of the invention. With reference to FIG. 1 and FIG. 7, a data control circuit 100 includes an output stage circuit 60, a switch circuit 80, and an impedance module 110. The description of the embodiment depicted in FIG. 8 may be deduced from the description of the embodiment shown in FIG. 3. Different from FIG. 3, FIG. 8 shows that the impedance module 110 is coupled between the input terminal of the switch circuit 80 and the source terminal of the p-type transistor P2.

In the present embodiment, the data control circuit 100 is configured in an n-type substrate of an integrated circuit. Since the p-type transistor P2 is located in the n-type substrate, the switching noise (or the substrate noise) flows to the system voltage Vdd through the source terminal of the p-type transistor P2, the drain terminal of the p-type transistor P1, a bulk of the p-type transistor P1, and the source terminal of the p-type transistor P1. The impedance module 110 is located between the input terminal of the switch circuit 80 and the source terminal of the p-type transistor P2, i.e., on the path where the noise flows, such that the amount of noise flowing to the system voltage Vdd may be significantly reduced. Accordingly, the noise interference caused by the switch circuit 80 may be effectively reduced by the data control circuit 100.

Figure 9:
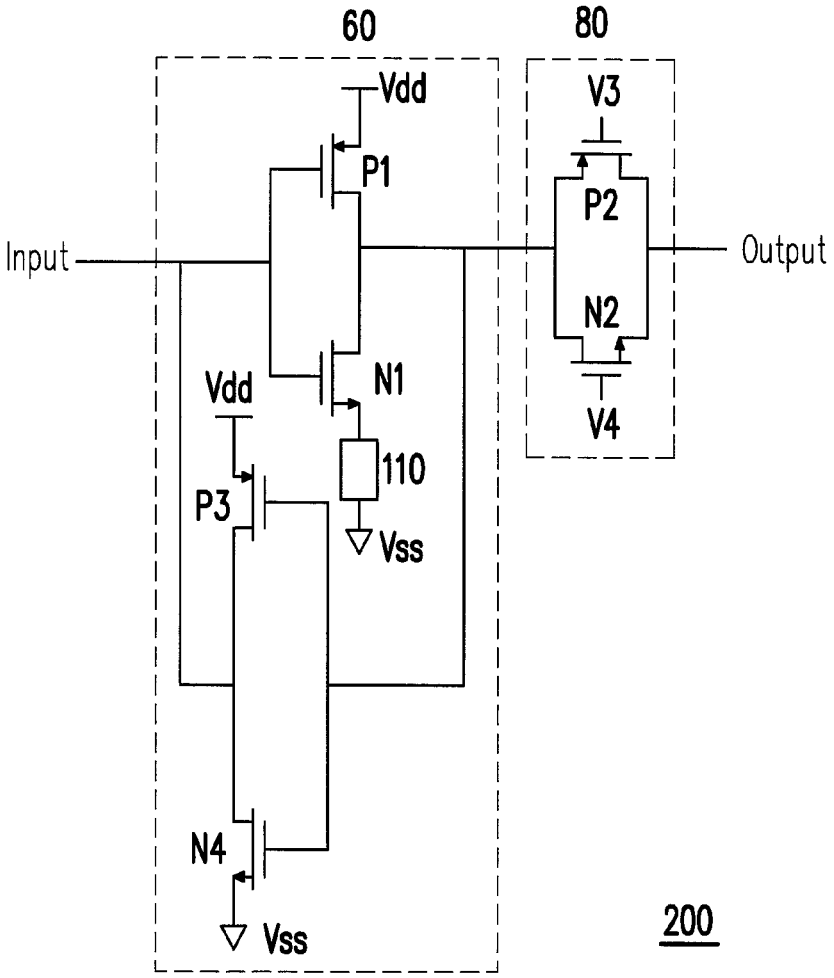
FIG. 9 is a schematic diagram illustrating a data control circuit according to an eighth embodiment of the invention.

However, the way to implement the output stage circuit 60 shown in FIG. 1 should not be limited to those shown in FIG. 2 to FIG. 8. FIG. 9 is a schematic diagram illustrating a data control circuit according to an eighth embodiment of the invention. With reference to FIG. 1 and FIG. 9, the data control circuit 200 shown in FIG. 9 may be deduced from the descriptions of the data control circuit 100 shown in FIG. 1 to FIG. 8. The data control circuit 200 includes an output stage circuit 60, a switch circuit 80, and an impedance module 110. Different from FIG. 2, FIG. 9 shows that the output stage circuit 60 includes a first inverter circuit and a second inverter circuit. An input terminal of the first inverter circuit is coupled to an input terminal of the output stage circuit 60, and an output terminal of the first inverter circuit is coupled to the output terminal of the output stage circuit 60. An input terminal of the second inverter circuit is coupled to the output terminal of the first inverter circuit, and an output terminal of the second inverter circuit is coupled to the input terminal of the first inverter circuit. The first inverter circuit and the second inverter circuit may be implemented in different manner according to different embodiments. The first inverter circuit includes the n-type transistor N1 and the p-type transistor P1, and the second inverter circuit includes an n-type transistor N4 and a p-type transistor P3, for instance.

As shown in FIG. 9, a source terminal of the n-type transistor N1 is coupled to the ground voltage Vss through the impedance module 110, a drain terminal of the n-type transistor N1 and a drain terminal of the p-type transistor P1 are collectively coupled to the output terminal of the output stage circuit 60, a gate terminal of the n-type transistor N1 and a gate terminal of the p-type transistor P1 are collectively coupled to the input terminal of the output stage circuit 60, and a source terminal of the p-type transistor P1 is coupled to the system voltage Vdd. Besides, a source terminal of the p-type transistor P3 is coupled to the system voltage Vdd, a drain terminal of the n-type transistor N4 and a drain terminal of the p-type transistor P3 are collectively coupled to the input terminal of the output stage circuit 60, a gate terminal of the n-type transistor N4 and a gate terminal of the p-type transistor P3 are collectively coupled to the output terminal of the output stage circuit 60, and a source terminal of the n-type transistor N4 is coupled to the ground voltage Vss.

In the present embodiment, the data control circuit 200 is configured in a p-type substrate of an integrated circuit. The switching noise (or the substrate noise) flows to the ground voltage Vss through the drain terminal of the n-type transistor N2, the drain terminal of the n-type transistor N1, the bulk of the n-type transistor N1, and the source terminal of the n-type transistor N1. The impedance module 110 is located between the source terminal of the n-type transistor N1 and the ground voltage Vss, i.e., on the path where the noise flows, such that the amount of noise flowing to the ground voltage Vss may be significantly reduced. Accordingly, the noise interference caused by the switch circuit 80 may be effectively reduced by the data control circuit 200.

Figure 10:
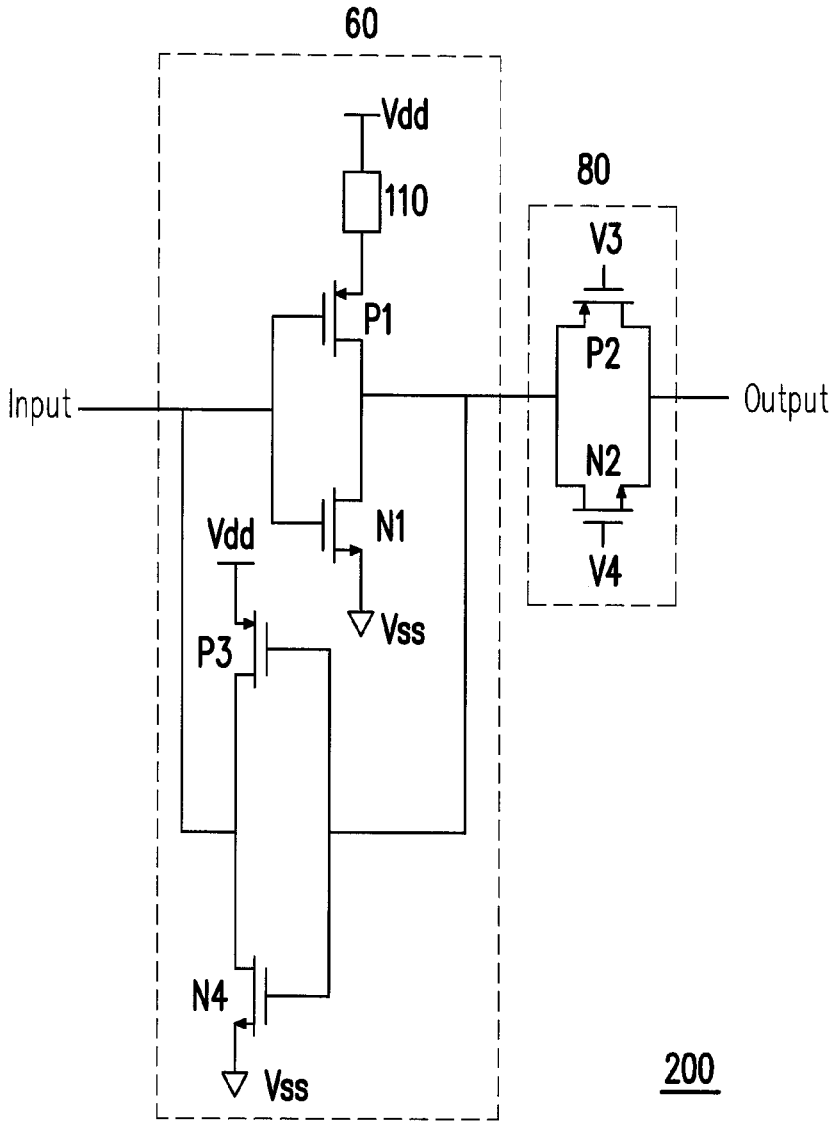
FIG. 10 is a schematic diagram illustrating a data control circuit according to a ninth embodiment of the invention.

FIG. 10 is a schematic diagram illustrating a data control circuit according to a ninth embodiment of the invention. The data control circuit 200 includes an output stage circuit 60, a switch circuit 80, and an impedance module 110. The description of the embodiment depicted in FIG. 10 may be deduced from the descriptions of the embodiments shown in FIG. 3 and FIG. 9. Different from FIG. 9, FIG. 10 shows that the impedance module 110 is located between the source terminal of the p-type transistor P1 and the system voltage Vdd.

In the present embodiment, the data control circuit 200 is configured in an n-type substrate of an integrated circuit. The switching noise (or the substrate noise) flows to the system voltage Vdd through the source terminal of the p-type transistor P2, the drain terminal of the p-type transistor P1, the bulk of the p-type transistor P1, and the source terminal of the p-type transistor P1. The impedance module 110 is located between the source terminal of the p-type transistor P1 and the system voltage Vdd, i.e., on the path where the noise flows, such that the amount of noise flowing to the system voltage Vdd may be significantly reduced. Accordingly, the noise interference caused by the switch circuit 80 may be effectively reduced by the data control circuit 200.

Figure 11:
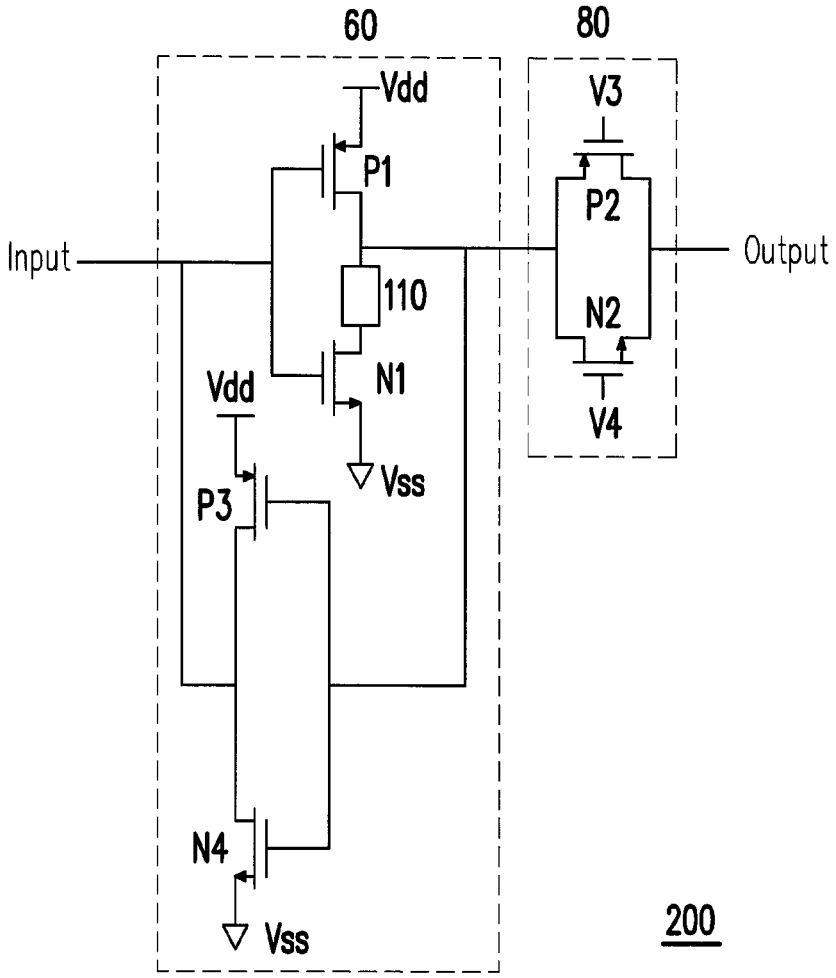
FIG. 11 is a schematic diagram illustrating a data control circuit according to a tenth embodiment of the invention.

FIG. 11 is a schematic diagram illustrating a data control circuit according to a tenth embodiment of the invention. The data control circuit 200 includes an output stage circuit 60, a switch circuit 80, and an impedance module 110. The description of the embodiment depicted in FIG. 11 may be deduced from the descriptions of the embodiments shown in FIG. 4 and FIG. 9. Different from FIG. 9, FIG. 11 shows that the impedance module 110 is located between the drain terminal of the n-type transistor N1 and the output terminal of the output stage circuit 60.

In the present embodiment, the data control circuit 200 is configured in a p-type substrate of an integrated circuit. The switching noise (or the substrate noise) flows to the ground voltage Vss through the drain terminal of the n-type transistor N2, the drain terminal of the n-type transistor N1, the bulk of the n-type transistor N1, and the source terminal of the n-type transistor N1. The impedance module 110 is located between the drain terminal of the n-type transistor N1 and the output terminal of the output stage circuit 60, i.e., on the path where the noise flows, such that the amount of noise flowing to the ground voltage Vss may be significantly reduced. Accordingly, the noise interference caused by the switch circuit 80 may be effectively reduced by the data control circuit 200.

Figure 12:
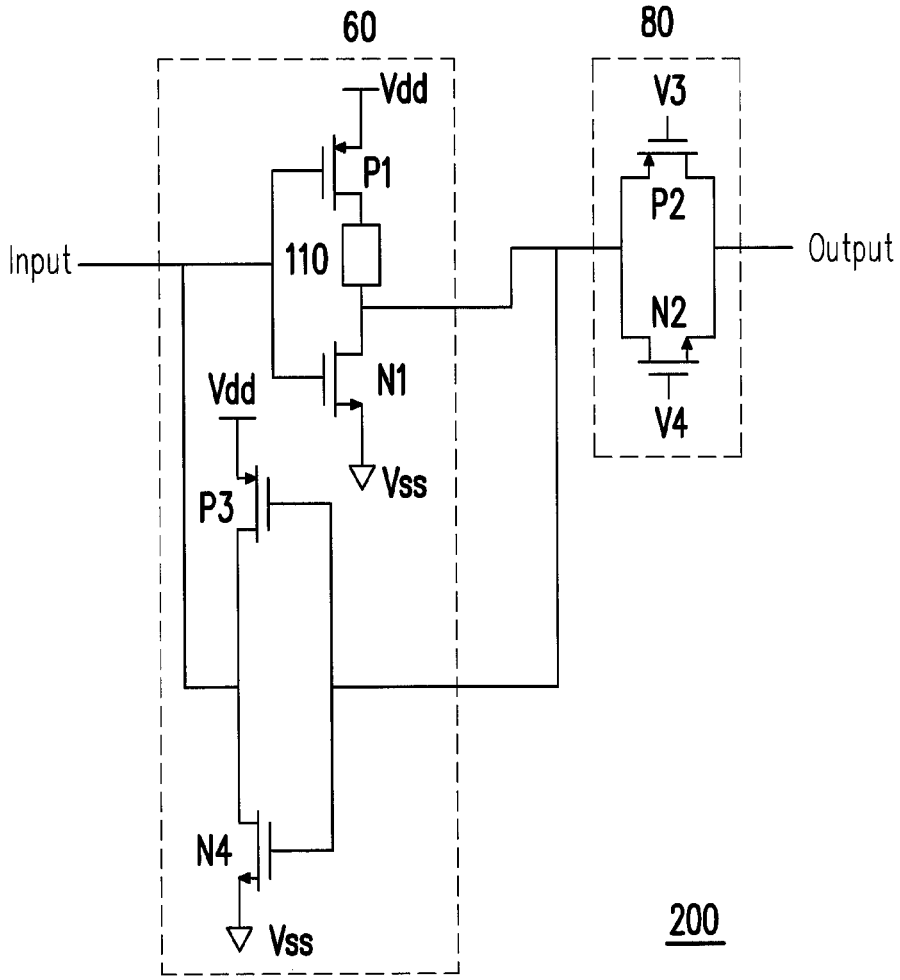
FIG. 12 is a schematic diagram illustrating a data control circuit according to an eleventh embodiment of the invention.

FIG. 12 is a schematic diagram illustrating a data control circuit according to an eleventh embodiment of the invention. The data control circuit 200 includes an output stage circuit 60, a switch circuit 80, and an impedance module 110. The description of the embodiment depicted in FIG. 12 may be deduced from the descriptions of the embodiments shown in FIG. 5 and FIG. 10. Different from FIG. 10, FIG. 12 shows that the impedance module 110 is located between the drain terminal of the p-type transistor P1 and the output terminal of the output stage circuit 60.

In the present embodiment, the data control circuit 200 is configured in an n-type substrate of an integrated circuit. The switching noise (or the substrate noise) flows to the system voltage Vdd through the source terminal of the p-type transistor P2, the drain terminal of the p-type transistor P1, the bulk of the p-type transistor P1, and the source terminal of the p-type transistor P1. The impedance module 110 is located between the drain terminal of the p-type transistor P1 and the output terminal of the output stage circuit 60, i.e., on the path where the noise flows, such that the amount of noise flowing to the system voltage Vdd may be significantly reduced. Accordingly, the noise interference caused by the switch circuit 80 may be effectively reduced by the data control circuit 200.

Figure 13:
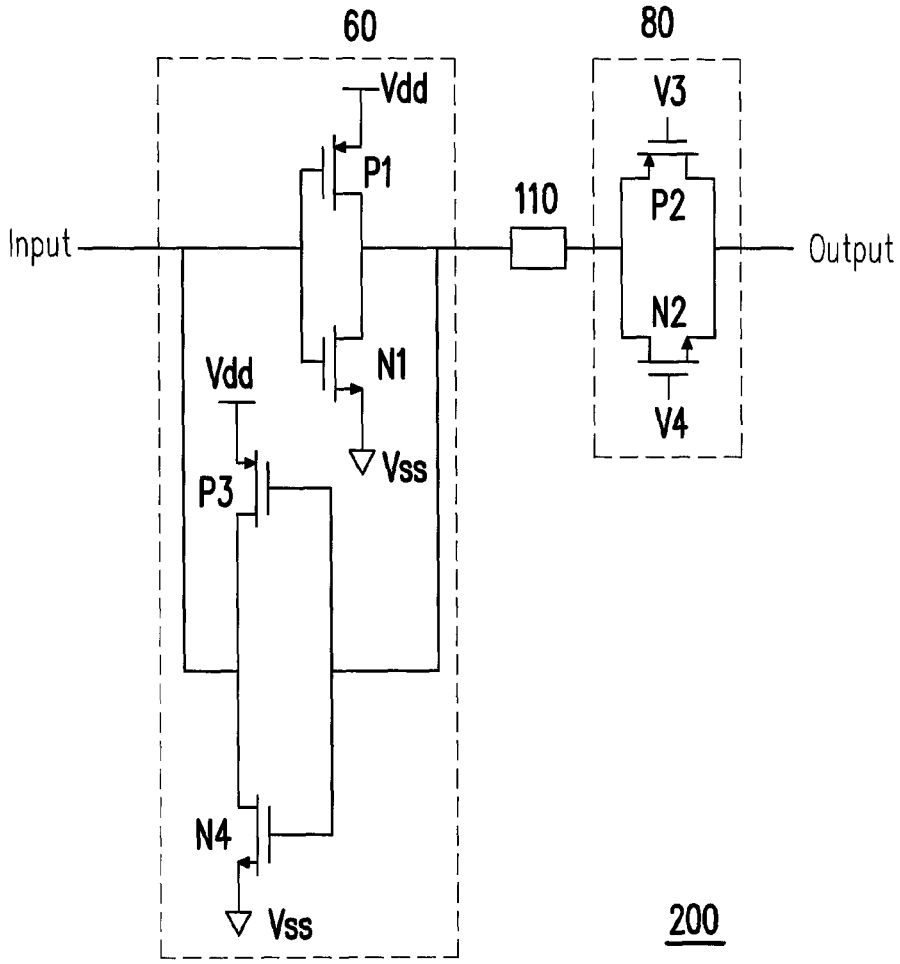
FIG. 13 is a schematic diagram illustrating a data control circuit according to a twelfth embodiment of the invention.

FIG. 13 is a schematic diagram illustrating a data control circuit according to a twelfth embodiment of the invention. The data control circuit 200 includes an output stage circuit 60, a switch circuit 80, and an impedance module 110. The description of the embodiment depicted in FIG. 13 may be deduced from the descriptions of the embodiments shown in FIG. 6 and FIG. 9 to FIG. 12. Different from FIG. 9 to FIG. 12, FIG. 13 shows that the impedance module 110 is coupled to a transmission path between the output terminal of the output stage circuit 60 and the input terminal of the switch circuit 80.

In some embodiments of the invention, the switching noise (or the substrate noise) flows to the system voltage Vdd through the source terminal of the p-type transistor P2, the drain terminal of the p-type transistor P1, the bulk of the p-type transistor P1, and the source terminal of the p-type transistor P1. In other embodiments of the invention, the switching noise (or the substrate noise) flows to the ground voltage Vss through the drain terminal of the n-type transistor N2, the drain terminal of the n-type transistor N1, the bulk of the n-type transistor N1, and the source terminal of the n-type transistor N1. The impedance module 110 is located between the output terminal of the output stage circuit 60 and the input terminal of the switch circuit 80, i.e., on the path where the noise flows, such that the amount of noise flowing to the system voltage Vdd and the ground voltage Vss may be significantly reduced. Accordingly, the noise interference caused by the switch circuit 80 may be effectively reduced by the data control circuit 200.

Figure 14:
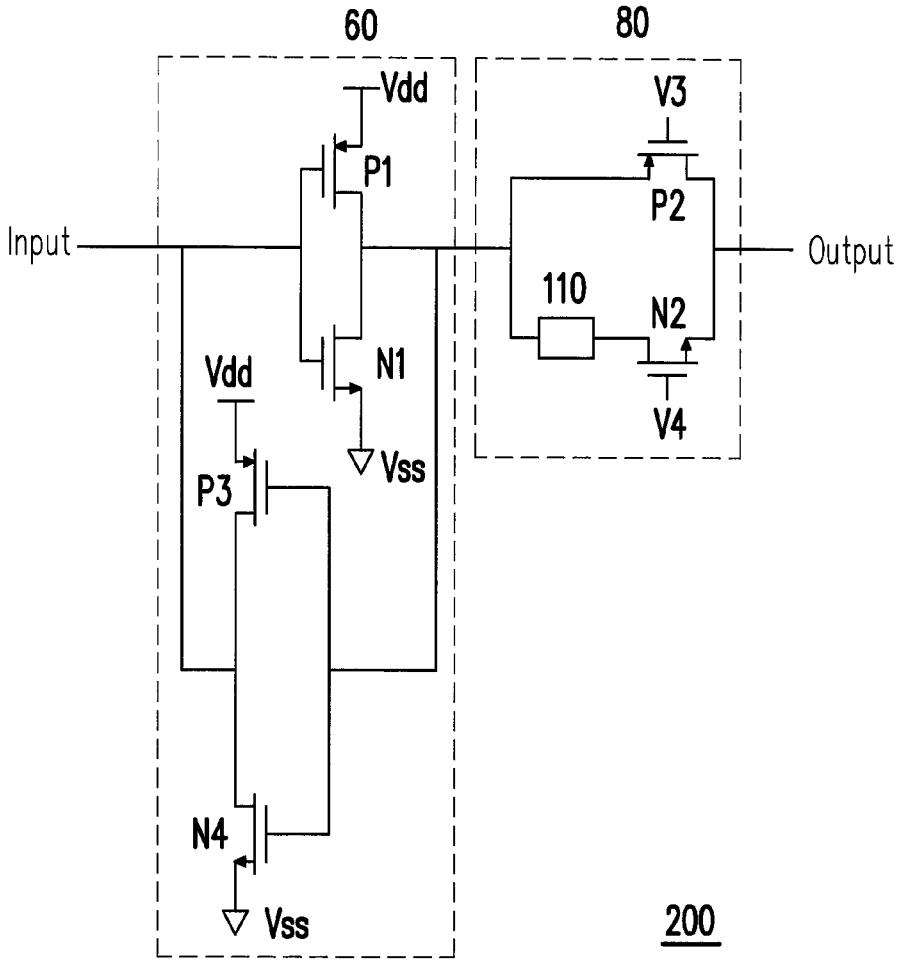
FIG. 14 is a schematic diagram illustrating a data control circuit according to a thirteenth embodiment of the invention.

FIG. 14 is a schematic diagram illustrating a data control circuit according to a thirteenth embodiment of the invention. The data control circuit 200 includes an output stage circuit 60, a switch circuit 80, and an impedance module 110. The description of the embodiment depicted in FIG. 14 may be deduced from the descriptions of the embodiments shown in FIG. 7 and FIG. 9. Different from FIG. 9, FIG. 14 shows that the impedance module 110 is coupled between the drain terminal of the n-type transistor N2 and the input terminal of the switch circuit 80.

In the present embodiment, the data control circuit 200 is configured in a p-type substrate of an integrated circuit. The switching noise (or the substrate noise) flows to the ground voltage Vss through the drain terminal of the n-type transistor N2, the drain terminal of the n-type transistor N1, the bulk of the n-type transistor N1, and the source terminal of the n-type transistor N1. The impedance module 110 is located between the drain terminal of the n-type transistor N2 and the input terminal of the switch circuit 80, i.e., on the path where the noise flows, such that the amount of noise flowing to the ground voltage Vss may be significantly reduced. Accordingly, the noise interference caused by the switch circuit 80 may be effectively reduced by the data control circuit 200.

Figure 15:
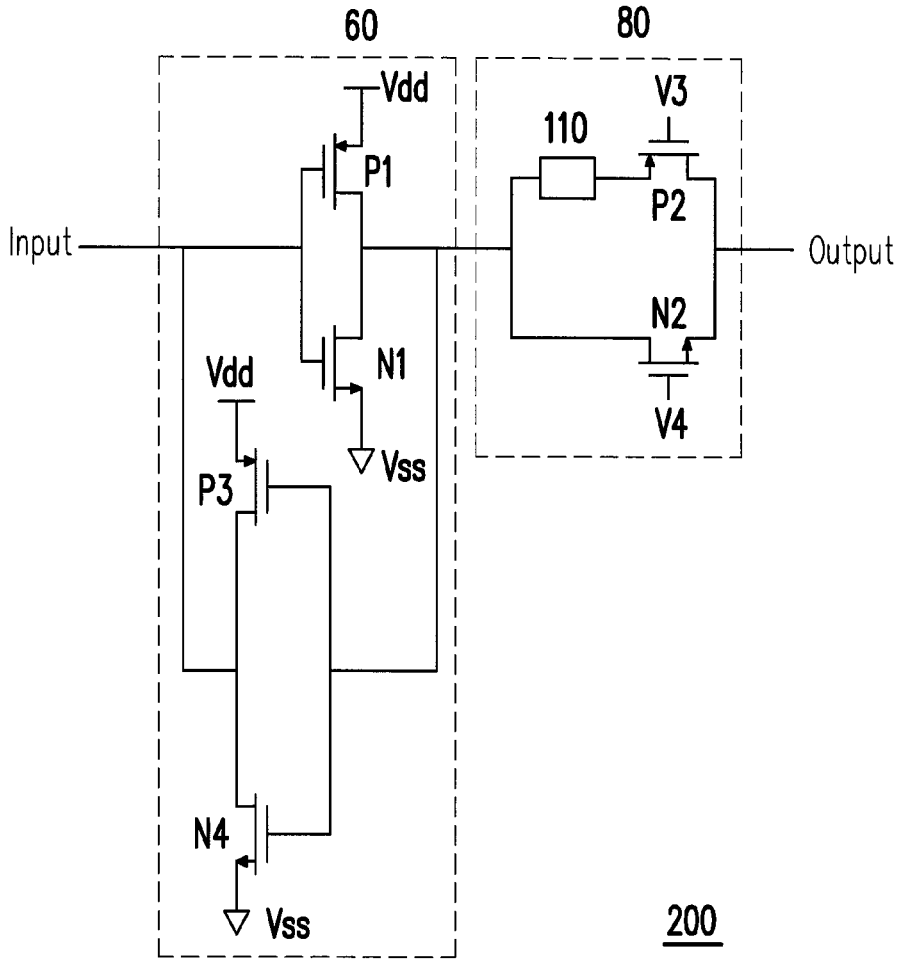
FIG. 15 is a schematic diagram illustrating a data control circuit according to a fourteenth embodiment of the invention.

FIG. 15 is a schematic diagram illustrating a data control circuit according to a fourteenth embodiment of the invention. The data control circuit 200 includes an output stage circuit 60, a switch circuit 80, and an impedance module 110. The description of the embodiment depicted in FIG. 15 may be deduced from the descriptions of the embodiments shown in FIG. 8 and FIG. 10. Different from FIG. 10, FIG. 15 shows that the impedance module 110 is coupled between the source terminal of the p-type transistor P2 and the input terminal of the switch circuit 80.

In the present embodiment, the data control circuit 200 is configured in an n-type substrate of an integrated circuit. The switching noise (or the substrate noise) flows to the system voltage Vdd through the source terminal of the p-type transistor P2, the drain terminal of the p-type transistor P1, the bulk of the p-type transistor P1, and the source terminal of the p-type transistor P1. The impedance module 110 is located between the input terminal of the switch circuit 80 and the source terminal of the p-type transistor P2, i.e., on the path where the noise flows, such that the amount of noise flowing to the system voltage Vdd may be significantly reduced. Accordingly, the noise interference caused by the switch circuit 80 may be effectively reduced by the data control circuit 200.

In addition to the above-mentioned manner to implement the output stage circuit 60 in the data control circuit 200, as provided in the eight embodiment to the fourteenth embodiment, the output stage circuit 60 in other embodiments may also be equipped with an n-type transistor N3 and a p-type transistor P4 which are controlled by a clock signal CLK and an inverting clock signal $\overline{CLK}$.

Figure 16:
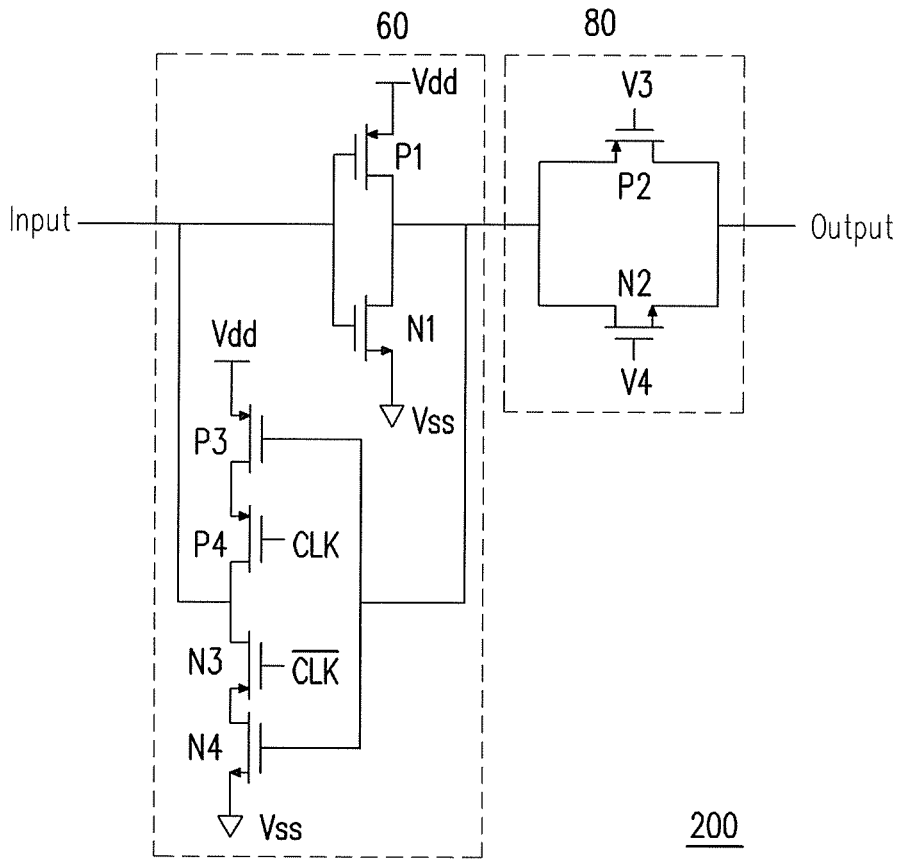
FIG. 16 is a schematic diagram illustrating a data control circuit according to a fifteenth embodiment of the invention.

FIG. 16 is a schematic diagram illustrating a data control circuit according to a fifteenth embodiment of the invention. With reference to FIG. 16, a data control circuit 200 includes an output stage circuit 60 and a switch circuit 80. The description of the embodiment depicted in FIG. 16 may be deduced from the descriptions of the embodiments shown in FIG. 9 to FIG. 15. Different from FIG. 9 to FIG. 15, FIG. 16 shows that the output stage circuit 60 further includes an n-type transistor N3 and a p-type transistor P4. As shown in FIG. 16, the source terminal of the p-type transistor P3 is coupled to the system voltage Vdd, and the drain terminal of the p-type transistor P3 is coupled to the source terminal of the p-type transistor P4. The drain terminal of the p-type transistor P4 and the drain terminal of the n-type transistor N3 are collectively coupled to the input terminal of the output stage circuit 60. The gate terminal of the n-type transistor N4 and the gate terminal of the p-type transistor P3 are collectively coupled to the output terminal of the output stage circuit 60. The gate terminal of the n-type transistor N3 and the gate terminal of the p-type transistor P4 are respectively coupled to the clock signal CLK and the inverting clock signal $\overline{CLK}$. The source terminal of the n-type transistor N3 is coupled to the drain terminal of the n-type transistor N4, and the source terminal of the n-type transistor N4 is coupled to the ground voltage Vss.

Note that the descriptions of the data control circuit 200 as shown in FIG. 16 may also be deduced from the descriptions of the impedance module 110 provided in the eighth embodiment to the fourteenth embodiment above, and therefore no further descriptions are provided hereinafter. The impedance module (not shown in FIG. 16) is configured in the output stage circuit 60, configured between the output stage circuit 60 and the switch circuit 80, or configured in the switch circuit 80. Thereby, the impedance module may effectively reduce noise flowing from the switch circuit 80 to the output stage circuit 60.

To sum up, in an embodiment of the invention, the impedance module is additionally configured on the noise-coupling transmission path in the data control circuit, e.g., configured in the output stage circuit, configured in the switch circuit, or configured between the output stage circuit and the switch circuit. Thereby, the noise generated by the pose-stage switch circuit may be effectively reduced, the pre-stage circuit may be protected from the noise interference, and errors resulting from the noise interference do not occur.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A data control circuit comprising:

an output stage circuit outputting a data signal, wherein the output stage circuit comprises a first n-type transistor and a first p-type transistor, a source terminal of the first n-type transistor being coupled to a ground voltage, a gate terminal of the first n-type transistor being coupled to an input terminal of the output stage circuit, a gate terminal of the first p-type transistor being coupled to the gate terminal of the first n-type transistor, a drain terminal of the first p-type transistor being coupled to an output terminal of the output stage circuit, a source terminal of the first p-type transistor being coupled to a system voltage;

a switch circuit, an input terminal of the switch circuit being coupled to [an] *the* output terminal of the output stage circuit, an output terminal of the switch circuit being coupled to a post-stage circuit, wherein the switch circuit determines whether to transmit the data signal of the output stage circuit to the post-stage circuit according to a control signal; and an impedance module [configured] *disposed* in the output stage circuit for reducing noise flowing from the switch circuit to the output stage circuit, wherein when the impedance module is formed by a transistor, the transistor has a first terminal coupled to a drain terminal of the first n-type transistor, a second terminal coupled to the output terminal of the output stage circuit, and a gate terminal coupled to a fixed voltage turning on the transistor.

2. The data control circuit as recited in claim 1, wherein the output stage circuit further comprises:

an inverter circuit, an input terminal of the inverter circuit being coupled to the output terminal of the output stage circuit, an output terminal of the inverter circuit being coupled to the input terminal of the output stage circuit.

3. The data control circuit as recited in claim 2, wherein the inverter circuit comprises:

a second p-type transistor, a source terminal of the second p-type transistor being coupled to the system voltage, a gate terminal of the second p-type transistor being coupled to the input terminal of the inverter circuit, a drain terminal of the second p-type transistor being coupled to the output terminal of the inverter circuit; and a second n-type transistor, a drain terminal of the second n-type transistor being coupled to the drain terminal of the second p-type transistor, a source terminal of the second n-type transistor being coupled to the ground voltage, a gate terminal of the second n-type transistor being coupled to the input terminal of the inverter circuit.

4. The data control circuit as recited in claim 2, wherein the inverter circuit comprises:

a second p-type transistor, a source terminal of the second p-type transistor being coupled to the system voltage, a gate terminal of the second p-type transistor being coupled to the input terminal of the inverter circuit;

a third p-type transistor, a source terminal of the third p-type transistor being coupled to a drain terminal of the second p-type transistor, a drain terminal of the third p-type transistor being coupled to the output terminal of the inverter circuit, a gate terminal of the third p-type transistor being controlled by a clock signal;

a second n-type transistor, a drain terminal of the second n-type transistor being coupled to the drain terminal of the third p-type transistor, a gate terminal of the second n-type transistor being controlled by an inverting signal of the clock signal; and a third n-type transistor, a drain terminal of the third n-type transistor being coupled to a source terminal of the second n-type transistor, a source terminal of the third n-type transistor being coupled to the ground voltage, a gate terminal of the third n-type transistor being coupled to the input terminal of the inverter circuit.

5. The data control circuit as recited in claim 1, wherein the switch circuit comprises:

a second n-type transistor, a source terminal of the second n-type transistor being coupled to the output terminal of the switch circuit, a drain terminal of the second n-type transistor being coupled to the input terminal of the switch circuit, a gate terminal of the second n-type transistor being controlled by the control signal.

6. The data control circuit as recited in claim 5, wherein the switch circuit further comprises:

a second p-type transistor, a source terminal of the second p-type transistor being coupled to the input terminal of the switch circuit, a drain terminal of the second p-type transistor being coupled to the output terminal of the switch circuit, a gate terminal of the second p-type transistor being controlled by an inverting signal of the control signal.

7. The data control circuit as recited in claim 1, wherein the switch circuit comprises:

a second p-type transistor, a source terminal of the second p-type transistor being coupled to the input terminal of the switch circuit, a drain terminal of the second p-type transistor being coupled to the output terminal of the switch circuit, a gate terminal of the second p-type transistor being controlled by the control signal.

8. The data control circuit as recited in claim 1, wherein the impedance module is at least one resistor, an n-type transistor, or a p-type transistor.

9. The data control circuit as recited in claim 1, wherein the impedance module just has the first terminal and the second terminal without connection to the gate terminal of the first n-type transistor.

*10. A data control circuit comprising:*

*an output stage circuit, disposed in a first conductivity type substrate, and configured to output a data signal, wherein the output stage circuit comprises a first inverter circuit, an input terminal of the first inverter circuit is coupled to an input terminal of the output stage circuit, and an output terminal of the first inverter circuit is coupled to an output terminal of the output stage circuit, wherein the first inverter circuit comprises a first n-type transistor and a first p-type transistor, a source terminal of the first n-type transistor is coupled to a ground voltage, a drain terminal of the first n-type transistor is coupled to the output terminal of the output stage circuit, a gate terminal of the first n-type transistor is coupled to the input terminal of the output stage circuit, a gate terminal of the first p-type transistor is coupled to the gate terminal of the first n-type transistor, a drain terminal of the first p-type transistor is coupled to the drain terminal of the first n-type transistor, a source terminal of the first p-type transistor is coupled to a system voltage;*

*a switch circuit, disposed in the first conductivity type substrate, wherein an input terminal of the switch circuit is coupled to the output terminal of the output stage circuit, an output terminal of the switch circuit is coupled to a post-stage circuit, and the switch circuit is configured to determine whether to transmit the data signal of the output stage circuit to the post-stage circuit according to a control signal, wherein the switch circuit comprises a second n-type transistor and a second p-type transistor, a source terminal of the second n-type transistor is coupled to the output terminal of the switch circuit, a drain terminal of the second n-type transistor is coupled to the input terminal of the switch circuit, a gate terminal of the second n-type transistor is controlled by the control signal, a source terminal of the second p-type transistor is coupled to the input terminal of the switch circuit, a drain terminal of the second p-type transistor is coupled to the output terminal of the switch circuit; and*

*an impedance module disposed in the output stage circuit, wherein the impedance module comprises a second conductivity type impedance transistor, one of the first conductivity type and the second conductivity type is n-type and the other is p-type, the impedance transistor is coupled between a second conductivity type transistor in the output stage circuit and the output terminal of the output stage circuit, and a gate terminal of the impedance transistor is coupled to a fixed voltage.*

*11. The data control circuit as recited in claim 10, wherein the output stage circuit further comprises:*

*a second inverter circuit, wherein an input terminal of the second inverter circuit is coupled to the output terminal of the first inverter circuit, and an output terminal of the second inverter circuit is coupled to the input terminal of the first inverter circuit.*

*12. The data control circuit as recited in claim 11, wherein the second inverter circuit comprises:*

*a third p-type transistor, wherein a source terminal of the third p-type transistor is coupled to the system voltage, a gate terminal of the third p-type transistor is coupled to the input terminal of the second inverter circuit, and a drain terminal of the third p-type transistor is coupled to the output terminal of the second inverter circuit; and*

*a third n-type transistor, wherein a drain terminal of the third n-type transistor is coupled to the drain terminal of the third p-type transistor, a source terminal of the third n-type transistor is coupled to the ground voltage, and a gate terminal of the third n-type transistor is coupled to the input terminal of the second inverter circuit.*

*13. The data control circuit as recited in claim 12, wherein the second inverter circuit further comprises:*

*a fourth p-type transistor, wherein a source terminal of the fourth p-type transistor is coupled to the drain terminal of the third p-type transistor, a drain terminal of the fourth p-type transistor is coupled to the output terminal of the second inverter circuit, and a gate terminal of the fourth p-type transistor is controlled by a clock signal; and*

*a fourth n-type transistor, wherein a drain terminal of the fourth n-type transistor is coupled to the drain terminal of the fourth p-type transistor, a gate terminal of the fourth n-type transistor is controlled by a inverting clock signal, a source terminal of the fourth n-type transistor is coupled to the drain terminal of the third n-type transistor.*

* * * * *